US007227119B2

United States Patent
Sato et al.

(10) Patent No.: US 7,227,119 B2
(45) Date of Patent: Jun. 5, 2007

(54) CURRENT VOLTAGE CONVERTER CIRCUIT

(75) Inventors: Yukio Sato, Yokohama (JP); Moriyasu Ichino, Yokohama (JP)

(73) Assignees: Kabushiki Kaisha Toshiba, Tokyo (JP); Sumitomo Electric Industries Ltd., Osaka-shi (JP)

( * ) Notice: Subject to any disclaimer, the term of this patent is extended or adjusted under 35 U.S.C. 154(b) by 70 days.

(21) Appl. No.: 11/118,347

(22) Filed: May 2, 2005

(65) Prior Publication Data

US 2005/0248329 A1 Nov. 10, 2005

(30) Foreign Application Priority Data

May 6, 2004 (JP) ............................... 2004-137477

(51) Int. Cl.
*H03F 3/08* (2006.01)
(52) U.S. Cl. ............................ 250/214 A; 250/214 R; 330/308
(58) Field of Classification Search ............ 250/214 A, 250/214 R, 214 AG; 330/308
See application file for complete search history.

(56) References Cited

U.S. PATENT DOCUMENTS

| 5,004,901 A | * | 4/1991 | Yoshimoto et al. ...... 250/201.5 |
| 5,174,909 A | * | 12/1992 | Ward ............................ 249/44 |
| 5,981,936 A | | 11/1999 | Fujiie |
| 6,175,278 B1 | * | 1/2001 | Hasegawa .................... 330/278 |
| 6,184,752 B1 | * | 2/2001 | Dautriche .................... 330/278 |
| 2003/0160152 A1 | * | 8/2003 | Ban et al. ............... 250/214 R |

FOREIGN PATENT DOCUMENTS

JP        10-256841        9/1998

* cited by examiner

*Primary Examiner*—Thanh X. Luu
*Assistant Examiner*—Stephen Yam
(74) *Attorney, Agent, or Firm*—Oblon, Spivak, McClelland, Maier & Neustadt, P.C.

(57) ABSTRACT

A current voltage converter circuit includes a light receiving element which receives a light output from a laser and generates a light current according to the light output, a current distributor circuit which distributes the light current from the light receiving element, the current distributor circuit being configured of a current mirror circuit which includes a transistor pair and a first operating amplifier. The current voltage converter circuit further includes a voltage converter circuit which converts a current distributed by the current distributor circuit into a voltage, the voltage converter circuit including a second operating amplifier.

11 Claims, 2 Drawing Sheets

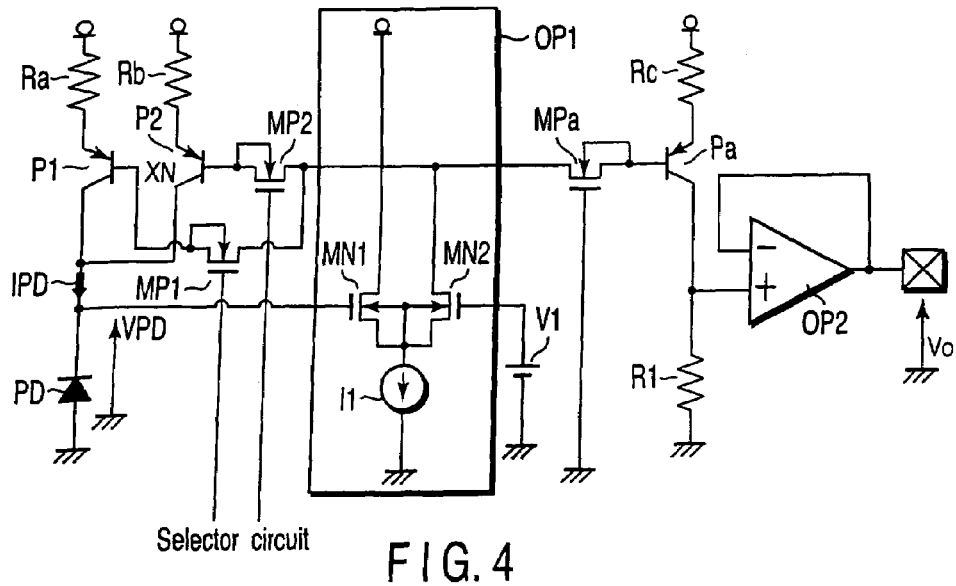
F I G. 4
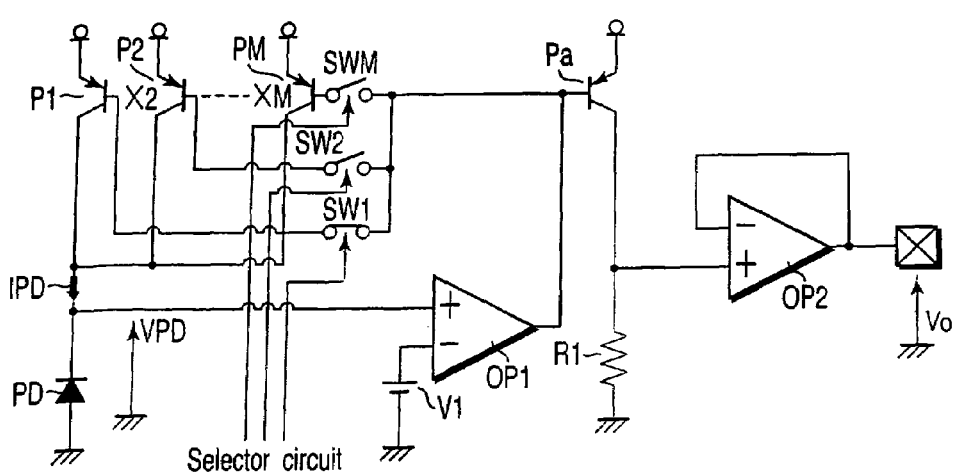
F I G. 5
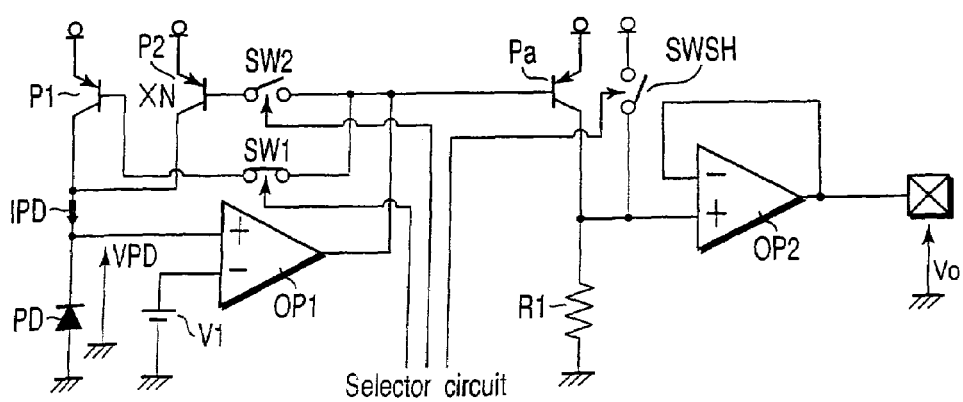
F I G. 6

CURRENT VOLTAGE CONVERTER CIRCUIT

CROSS-REFERENCE TO RELATED APPLICATIONS

This application is based upon and claims the benefit of priority from prior Japanese Patent Application No. 2004-137477, filed May 6, 2004, the entire contents of which are incorporated herein by reference.

BACKGROUND OF THE INVENTION

1. Field of the Invention

The present invention relates to a current voltage converter circuit. More particularly, the invention relates to a current voltage converter circuit for use in, for example, a laser output automatic control system (hereinafter, referred to as an automatic power control (APC) system) for stabilizing a laser output at a predetermined value.

2. Description of the Related Art

In general, in the field of optical transmission such as wavelength division multiplexing (WDM) or a compact disk (CD), a laser output is stabilized at a predetermined value by using an APC system. Conventionally, in the APC system of this type, a current voltage converter circuit comprising a photo diode, a resistor, and an operating amplifier is widely used to detect a laser output. Some of the current voltage converter circuits each comprise a plurality of resistors having their different resistance values, wherein one of the plurality of resistors is selected, thereby making it possible to absorb a distortion of the photo diode (for example, a distortion of a photo receiving sensitivity according to a system). However, in the case of this current voltage converter circuit, the number of resisters increases as the distortion of the photo diode becomes large. Thus, there has been a disadvantage that this converter circuit is unsuitable to integration and is likely to increase in cost.

In addition, there is proposed a current voltage converter circuit further comprising a current distributor which distributes a current (light current) from the photo diode (refer to, for example, Jpn. Pat. Appln. KOKAI Publication No. 10-256841). This publicly known example discloses a system of adjusting a light current in a range which meets an output voltage range of the current voltage converter circuit by means of the current distributor, followed by supplying the adjusted current to the voltage converter circuit composed of the operating amplifier and the resistor.

In the case of the-described publicly known example, however, the current distributor is composed of a current mirror circuit. Thus, there has been a problem that, although the number of resistors can be reduced, a current after distributed is weak in fluctuation of a power voltage and a temperature change.

BRIEF SUMMARY OF THE INVENTION

According to a first aspect of the present invention, there is provided a current voltage converter circuit comprises: a light receiving element which receives a light output from a laser and generates a light current according to the light output; a current distributor circuit which distributes the light current from the light receiving element, the current distributor circuit being configured of a current mirror circuit which includes a transistor pair and a first operating amplifier; and a voltage converter circuit which converts a current distributed by the current distributor circuit into a voltage, the voltage converter circuit including a second operating amplifier.

BRIEF DESCRIPTION OF THE SEVERAL VIEWS OF THE DRAWING

FIG. 4 is a circuit diagram showing in more detail a configuration of the current voltage converter circuit shown in FIG. 3;

FIG. 5 is a circuit diagram showing a basic configuration of a current voltage converter circuit according to a fourth embodiment of the present invention; and FIG. 6 is a circuit diagram showing a basic configuration of a current voltage converter circuit according to a fifth embodiment of the present invention.

DETAILED DESCRIPTION OF THE INVENTION

Hereinafter, embodiments of the present invention will be described with reference to the accompanying drawings.

(First Embodiment)

Figure 1:
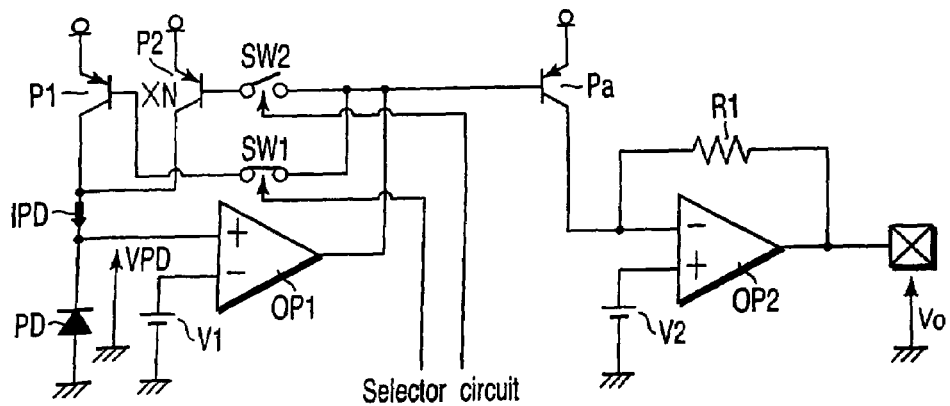
FIG. 1 is a circuit diagram showing a basic configuration of a current voltage converter circuit according to a first embodiment of the present invention.

FIG. 1 shows a basic configuration of a current voltage converter circuit according to a first embodiment of the present invention. In the first embodiment, a current distributor circuit for distributing a light current from a photo diode is configured by using a transistor and an operating amplifier. A description will be given with respect to a case in which a current voltage converter circuit is configured so as to convert a light current into a voltage after the light current has been adjusted to a current optimal to current voltage conversion by means of the current distributor circuit.

As shown in FIG. 1, an anode side is grounded on a photo diode (light receiving element) PD which receives a laser output emitted from a laser and outputs a light current IPD according to that laser output. A cathode side of the photo diode PD is connected to a non-inverted input end (+) of an operating amplifier (first operating amplifier) OP1 and is connected to each of collectors of PNP transistors (second and third bipolar transistors) P1, P2. Each of emitters of the PNP transistors P1, P2 is connected to a power supply terminal. In addition, bases of the PNP transistors P1, P2 are connected to an output end of the operating amplifier OP1 and a base of a PNP transistor (first bipolar transistor) Pa via switches (first and second switches) SW1, SW2, respectively. Either of the switches SW1, SW2 is selected by, for example, an external selector circuit.

Here, the PNP transistors P1, Pa and the PNP transistors P2, Pa configure current mirror circuits having their different current distribution values, respectively, in accordance with a combination with the operating amplifier OP1. An emitter area (size) of the PNP transistor P1 is equal to an emitter area of the PNP transistor Pa (×1), for example. In addition, an emitter area of the PNP transistor P2 is N times (×N) of an emitter area of the PNP transistor Pa, for example. Namely, the current mirror circuit shares the PNP transistor Pa, thereby configuring a first transistor pair (P1, Pa) and a second transistor pair (P2, Pa) having their different mirror ratios.

An emitter of the PNP transistor Pa is connected to a power supply terminal. A collector of the PNP transistor Pa is connected to an inverted input end (−) of an operating amplifier (second operating amplifier) OP2 and one end of a resistor R1. The other end of the resistor R1 is connected to an output end of the operating amplifier OP2. A negative return amplifier whose return amount is "1" is composed of the operating amplifier OP2 and the resistor R1.

A predetermined (reference) voltage V1 is applied to the inverted input end of the operating amplifier OP1 and a predetermined (reference) voltage V2 is applied to the non-inverted input end of the operating amplifier OP2, respectively. The voltages V1, V2 each are defined as a grounding (GND) reference.

In the case of the present embodiment, the current distributor circuit is composed of the current mirror circuit including the operating amplifier OP1 and the PNP transistors P1, P2, Pa, and the voltage converter circuit is composed of the operating amplifier OP2 and the resistor R1, respectively.

In such a configuration, assume that a sufficiently small amount of a current flows into the non-inverted input end side of the operating amplifier OP1. Then, all the light currents IPD outputted from the photo diode PD flow into the PNP transistor P1 or P2. The output end of the operating amplifier OP1 is connected to each of the bases of the PNP transistors P1, P2 via the switches SW1, SW2 and is connected to the base of the PNP transistor Pa. Here, when attention is paid to the fact that a polarity between a base voltage fluctuation component and a collector voltage fluctuation component of the PNP transistor P1 is inverted, a negative return is obtained between the non-inverted input end side of the operating amplifier OP1 and the collector of the PNP transistor P1. Namely, as long as an open loop gain of the operating amplifier OP1 is sufficiently high, a return is applied such that a voltage VPD at both ends of the photo diode PD is equal to the voltage V1.

First, assume that the switch SW1 is turned ON and the switch SW2 is turned OFF. Then, by the PNP transistor P1 and the operating amplifier OP1, a current corresponding to the light current IPD from the photo diode PD flows into the PNP transistor Pa which configures the current mirror circuit. Then, the current corresponding to the light current IPD is converted into a voltage Vo by the voltage converter circuit composed of the operating amplifier OP2 and the resistor R1. An output voltage Vo is shown by formula (0a) below. Vo=V2−IPD×R1 . . . (0a). At this time, each of base currents of the PNP transistors P1, Pa is supplied from the output end of the operating amplifier OP1. In this manner, in comparison with a conventional case (for example, Jpn. Pat. Appln. KOKAI Publication No. 10-256841) for supplying a base current by means of a light current (IPD), a decrease of the light current (IPD) can be prevented by the base current. Namely, the base currents of the PNP transistors P1, Pa which depend on HFE (the base-collector current gain) are supplied from the output end of the operating amplifier OP1, thereby making it possible to solve a failure that "in the case where a light current (IPD) is supplied as a base current, an HFE distortion is obtained as a distortion of conversion voltages". Moreover, the HFE fluctuates due to a temperature change, thus making it possible to improve temperature (change) characteristics of the current voltage converter circuit.

Further, in the photo diode PD, the voltage VPD at both ends of the photo diode is fixed by the voltage V1. In general, even if an amount of light received is constant, a light current (IPD) changes if a voltage (VPD) at both ends of the photo diode changes. In this configuration, however, the voltage VPD at both ends of the photo diode is fixed, and thus, a relationship between a power supply voltage and the voltage VPD at the both ends is not irrelevant. Consequently, the light current IPD does not fluctuate due to a fluctuation of the power supply voltage.

Further, a collector electric potential of the PNP transistor Pa is fixed to the voltage V2 by means of a negative return between the operating amplifier OP2 and the resistor R1. However, the voltage V2 is defined as a GND reference. Similarly, a collector electric potential of the PNP transistor P1 is also fixed to the voltage V1 defined as a GND reference. In this manner, in the case where the power supply voltage has fluctuated, a voltage between the collector and the emitter of the PNP transistor Pa also fluctuates. Due to an early effect of the transistor, the collector current of the PNP transistor P1 fluctuates even if the voltage between the base and the emitter of the PNP transistor Pa is constant. However, a voltage between the collector and the emitter of the PNP transistor P1 also fluctuates similarly. Thus, an advantageous effect of the current mirror circuit is offset and an output current fluctuation due to the power supply voltage is remarkably reduced.

Therefore, with a configuration of the present embodiment, it becomes possible to improve power supply voltage (fluctuation) characteristics or temperature (change) characteristics during current voltage conversion. Moreover, a light current can be converted into a voltage after the current has been adjusted to a current optical for current voltage conversion. That is, in the case where the switch SW1 is turned OFF and the switch SW2 is turned ON, all the light currents IPD from the photo diode PD flow into the PNP transistor P2. In this case, by means of the PNP transistor Pa and the operating amplifier OP1, the emitter area of the PNP transistor P2 which configures the current mirror Pa is N times (×N) of the emitter area of the PNP transistor Pa. Therefore, a current IPD/N flows into the PNP transistor Pa. This current IPD/N is converted into a voltage Vo by the voltage converter circuit composed of the operating amplifier OP2 and the resistor R1. An output voltage Vo is shown by formula (0b) below. Vo=V2−IPD×R1/N . . . (0b).

As described above, the transistors P1, P2 of size corresponding to a required current distribution value can be properly selected in accordance with a distortion of a photo receiving sensitivity of a photo diode corresponding to a system to be configured. In this manner, it becomes possible to reduce an output voltage after converted within a predetermined range regardless of a current range of the light current IPD. As a result, even when the light current IPD from the photo diode exceeds the output voltage range of the current voltage converter circuit, power supply voltage (fluctuation) characteristics or temperature (change) characteristics during current voltage conversion can be improved, thereby making it possible to achieve current voltage conversion with high precision.

In the first embodiment described above, the case has been described in which the current mirror circuit is configured by using the bipolar transistors P1, P2, Pa with the PNP structure. With being limited thereto, for example, similar advantageous effect can be expected in the case where the current mirror circuit is configured by using a P-channel metal oxide semiconductor (MOS) transistor.

In addition, the number of transistors selected by a switch is not limited to "2". It is possible to provide a plurality of (three or more) transistors of their different sizes according to a required current distribution value in advance.

Further, a configuration may be provided so as to impart an arbitrary electric potential defined as a GND reference to a grounding (anode) side of the photo diode PD.

(Second Embodiment)

Figure 2:
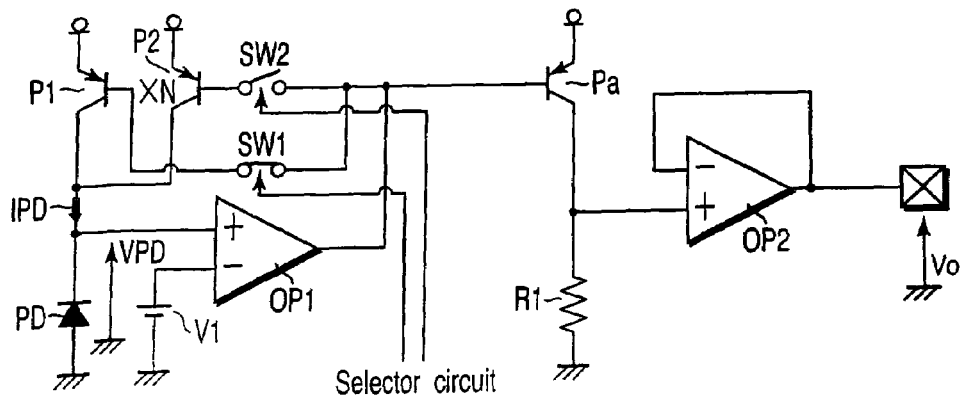
FIG. 2 is a circuit diagram showing a basic configuration of a current voltage converter circuit according to a second embodiment of the present invention.

FIG. 2 shows a basic configuration of a current voltage converter circuit according to a second embodiment of the present invention. In the second embodiment, a description will be given with respect to a case in which the operating amplifier OP2 is configured as a buffer amplifier in the current voltage converter circuit shown in the first embodiment (refer to FIG. 1). Like elements shown in FIG. 1 are designated by like reference numerals, and a detailed description is omitted here. That is, in the case of the current voltage converter circuit according to the second embodiment, for example, as shown in FIG. 2, the resistor R1 is connected between the non-inverted input end of the operating amplifier OP2 and a ground (first reference electric potential). In this manner, the operating amplifier OP2 functions as a buffer amplifier.

In the case where such a configuration is provided, an output voltage Vo of the operating amplifier OP2 is shown by formula (1) below.

$$Vo = R1 \times IPD \quad (1)$$

With the configuration of the present embodiment, in the case where a current voltage converter circuit is integrated, only the resistor R1 is externally provided, thereby making it possible to incorporate another circuit portion other than the resistor R1 in an integrated circuit. Moreover, in the case where one end of the resistor R1 is connected to an external GND terminal, only the other end of the resistor R1 can be connected to the integrated circuit side. In this manner, only one end for resistor connection in the integrated circuit will suffice. Thus, in addition to an advantageous effect which is similar to that in the case of the first embodiment, it becomes possible to reduce a cost of an integrated circuit which increases with an increased number of connection terminals.

In the second embodiment as well, for example, it is possible to configure a current mirror circuit by using the P-channel MOS transistor instead of the bipolar transistors P1, P2, Pa having the PNP structure.

In addition, a configuration may be provided so as to impart an arbitrary electric potential defined as a GND reference to the grounding (anode) side of the photo diode PD and the grounding side of the resistor R1, respectively.

(Third Embodiment)

Figure 3:
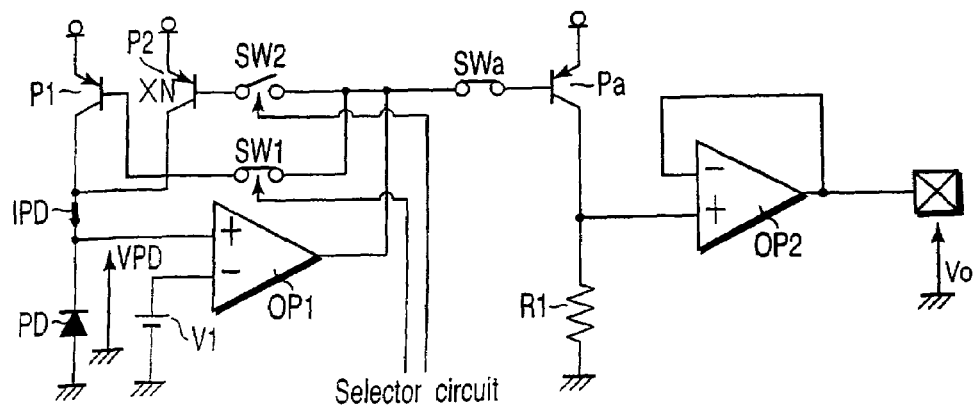
FIG. 3 is a circuit diagram showing a basic configuration of a current voltage converter circuit according to a third embodiment of the present invention.

FIG. 3 shows a basic configuration of a current voltage converter circuit according to a third embodiment of the present invention. The third embodiment describes a case in which a configuration is provided so as to eliminate an advantageous effect of an ON resistance of a switch SW1 in the current voltage converter circuit shown in the second embodiment (refer to FIG. 2). Like elements shown in FIG. 2 are designated by like reference numerals, and a detailed description is omitted here. That is, in the case of the current voltage converter circuit according to the third embodiment, for example, as shown in FIG. 2, a dummy switch (third switch) SWa having an ON resistance which is equal to the switch SW1 is inserted into the base of the PNP transistor Pa. The dummy switch SWa is always set to an ON state.

Here, in the case of the current voltage converter circuit shown in the second embodiment (refer to FIG. 2), between a voltage VBE1 between the base and the emitter of the PNP transistor P1 and a voltage VBEa between the base and the emitter of the PNP transistor Pa, a relational formula shown in formula (2) below is established:

$$VBEa = VBE1 + IB1 \times RSW1 \quad (2)$$

wherein the RSW1 is defined as an ON resistance of the switch SW1, and the IB1 is defined as a base current of the PNP transistor P1.

A current mirror circuit including the PNP transistor P1, Pa and the operating amplifier OP1 is ideally "VBEa=VBE1". Therefore, in the case of the current voltage converter circuit shown in the second embodiment, a current flowing into the PNP transistor Pa is different from the light current IPD by a voltage corresponding to IB1×RSW1.

In contrast, in the case of the current voltage converter circuit shown in the present embodiment (refer to FIG. 3), the dummy switch SWa having an ON resistance which is equal to the switch SW1 is added, whereby, between the voltage VBE1 between the base and the emitter of the PNP transistor P1 and the voltage VBEa between the base and the emitter of the PNP transistor Pa, a relational formula shown in formula (3) below is established:

$$VBEa + IBa \times RSWa = VBE1 + IB1 \times RSW1 \quad (3)$$

wherein the RSWa is defined as an ON resistance of the switch Swa, and the IBa is defined as a base current of the PNP transistor Pa.

In formula (3) above, "RSW1=RSWa" is established, and both of the collector currents of the PNP transistors P1, Pa are equal to each other due to a Miller effect, and thus, IB1=IBa is obtained. In this manner, it is possible that a current mirror circuit including the PNP transistors P1, Pa and the operating amplifier OP1 is ideally "VBEa=VBE1". Namely, a current voltage converter circuit with higher precision which is not susceptive to advantageous effect of the ON resistance of the switch SW1 can be provided by adding the dummy switch SWa.

FIG. 4 shows in more detail a configuration of the current voltage converter circuit shown in the third embodiment (at an element level). In the case of this example, the switches SW1, SW2, SWa are composed of P-channel MOS transistors MP1, MP2, MPa, respectively. In addition, at least the operating amplifier OP1 is composed of a MOS type differential amplifier which is composed of N-channel MOS transistors MN1, MN2 and a current source I1. In this manner, a differential input section of the operating amplifier OP1 is provided as a MOS type structure, whereby all the light currents IPD flow into either of the PNP transistors P1, P2. As a result, a configuration which is hardly susceptive to advantageous effect of the HFE can be provided. Further, as shown in FIG. 4, resistors Ra, Rb, Rc are inserted between an emitter and a power supply of the PNP transistors P1, P2, Pa, whereby a current voltage converter circuit having higher precision is provided by reducing a pair distortion of the PNP transistors P1, P2, Pa and an influence of an early effect.

In the third embodiment as well, for example, a current mirror circuit may be configured by using a P-channel MOS transistor instead of the bipolar transistors P1, P2, Pa having the PNP structure. In addition, a bipolar transistor having a NPN structure can be configured instead of the N-channel MOS transistors MN1, MN2. Of course, an emitter of each of the PNP transistors P1, P2, Pa may be directly connected to a power supply without inserting the resistors Ra, Rb, Rc.

In addition, the number of transistors selected by a switch is not limited to "2". It is possible to provide a plurality of (three or more) transistors of their different sizes according to a required current distribution value in advance and an N-channel MOS transistor may be configured.

Further, a configuration may be provided so as to impart an arbitrary electric potential defined as a GND reference to the grounding (anode) side of the photo diode PD and the grounding side of the resistor R1, respectively.

(Fourth Embodiment)

FIG. 5 shows a basic configuration of a current voltage converter circuit according to a fourth embodiment of the present invention. The fourth embodiment describes a case in which a transistor pair configuring a current mirror circuit (the number of transistors selected by a switch) is increased in the current voltage converter circuit shown in the second embodiment (refer to FIG. 2). Like elements shown in FIG. 2 are designated by like reference numerals, and a detailed description is omitted here. That is, in the case of the current voltage converter circuit according to the fourth embodiment, for example, as shown in FIG. 5, a plurality of PNP transistors P1, P2, . . . , PM can be switched by switches SW1, SW2, . . . , SWM, respectively. An emitter area of each of the PNP transistors P1, P2, . . . , PM is equal to, two times (×2), . . . , M times (×M), respectively, of an emitter area of the PNP transistor Pa. Thus, a plurality of PNP transistors P1, P2, . . . , PM of their different sizes are provided, thereby making it possible to select a variety of current distribution values by the switches SW1,SW2, . . . , SWM.

With the configuration of the present embodiment, due to a distortion of the photo receiving sensitivity of the photo diode PD corresponding to a system to be configured, current voltage conversion with high precision can be achieved without increasing the number of resistors even in the case where a light current from the photo diode PD exceeds an output voltage range of the current voltage converter circuit.

In the fourth embodiment as well, for example, it is possible to configure a current mirror circuit by using a P-channel MOS transistor instead of the bipolar transistors P1, P2, . . . , PM, Pa having the PNP structure.

In addition, a configuration may be provide so as to impart an arbitrary electric potential defined as a GND reference to the grounding (anode) side of the photo diode PD and the grounding side of the resistor R1, respectively.

(Fifth Embodiment)

FIG. 6 shows a basic configuration of a current voltage converter circuit according to a fifth embodiment of the present invention. The fifth embodiment describes a case in which a switch (control switch) SWSH is added in the current voltage converter circuit shown in the second embodiment (refer to FIG. 2). Like elements shown in FIG. 2 are designated by like reference numerals, and a detailed description is omitted here. That is, in the case of the current voltage converter circuit according to the fifth embodiment, for example, as shown in FIG. 6, the switch SWSH for timing adjustment is inserted between a non-inverted input end of the operating amplifier OP2 and the power supply terminal (second reference electric potential). This switch SWSH for timing adjustment is used to protect a laser from being damaged in the case where an APC system is configured, for example. In addition, the switch SWSH may be composed of a MOS transistor or a bipolar transistor as well as a mechanical switch.

In general, in the APC system, the light current IPD outputted from the photo diode PD and the current actually supplied to the laser flow in an opposite direction to each other. For example, in the APC system, when the light current IPD from the photo diode PD which is monitoring the reduction is reduced after a laser output has been reduced, a current to be supplied to the laser is increased, whereby an attempt is made to increase the laser output. Conversely, when the light current IPD from the photo diode PD which is monitoring the rise is increased after the laser output has risen, the current to be supplied to the laser is reduced, whereby an attempt is made to reduce the laser output.

In the meantime, in the case where an operation of the APC system is stopped (shut down), the laser output goes OFF. Thus, the light current IPD from the photo diode PD also becomes "0". However, in this state, namely, when the light current IPD is "0", assume that the shutdown of the APC system is released. In this case, the APC system supplies to a laser the maximum current of a capacity which the system has, in accordance with the operation. This rush current may cause laser breakage.

Then, the switch SWSH is turned ON during shutdown. Then, a voltage is outputted from the operating amplifier OP2, as if the maximum light current were outputted from the photo diode. Therefore, the shutdown is released in this state, the APC system restarts the current supplied to the laser from the minimum current in accordance with the operation. As a result, it becomes possible to prevent the laser from being broken due to a rush current during release of shutdown.

With the configuration of the present embodiment, even in the case where the light current from the photo diode PD exceeds an output voltage range of the current voltage converter circuit, current voltage conversion with high precision can be achieved. In addition, when the APC system is configured, it becomes possible to prevent the breakage due to the laser rush current.

In the fifth embodiment as well, for example, it is possible to configure a current mirror circuit by using a P-channel MOS transistor instead of the bipolar transistors P1, P2, Pa having the PNP structure.

Further, the number of transistors selected by a switch is not limited to "2". It is possible to provide a plurality of (three or more) transistors of their different sizes according to a required current distribution current in advance.

Moreover, a configuration may be provided so as to impart an arbitrary electric potential defined as a GND reference to the grounding (anode) side of the photo diode PD and the grounding side of the resistor R1, respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current voltage converter circuit comprising:
   a light receiving element which receives a light output from a laser and generates a light current according to the light output;
   a current distributor circuit which distributes the light current from the light receiving element, the current distributor circuit being configured of a current mirror circuit which includes a transistor pair and a first operating amplifier;

a voltage converter circuit which converts a current distributed by the current distributor circuit into a voltage, the voltage converter circuit including a second operating amplifier;

wherein the voltage converter circuit includes a resistor connected between a non-inverted input end of the second operating amplifier and a first reference electric potential; and the second operating amplifier is configured as a buffer amplifier.

2. A current voltage converter circuit according to claim 1, wherein the current mirror circuit comprises a switch to select any one of at least two pairs of transistors, the at least two pairs of transistors having different current distribution values according to a distortion of a light receiving sensitivity of the light receiving element which corresponds to a system to be configured.

3. A current voltage converter circuit according to claim 1, wherein the resistor is externally provided at the outside of an integrated circuit during integration.

4. A current voltage converter circuit according to claim 1, wherein a control switch to control an operation during shutdown of a system to be configured is inserted between a non-inverted input end and a second reference electric potential of the second operating amplifier.

5. A current voltage converter circuit according to claim 1, wherein the current mirror circuit has at least:

a first transistor pair in which one end of a first switch is connected to a base or a gate of a first transistor, one end of a second switch is connected to the other end of the first switch, and a base or a gate of a second transistor is connected to the other end of the second switch; and a second transistor pair in which one end of the first switch is connected to a base or a gate of the first transistor, one end of a third switch is connected to the other end of the first switch, and a base or a gate of a third transistor is connected to the other end of the third switch.

6. A current voltage converter circuit according to claim 1, wherein the current mirror circuit has at least:

a first transistor pair in which one end of a first switch is connected to a base or a gate of a first transistor, one end of a second switch is connected to the other end of the first switch, and a base or a gate of a second transistor is connected to the other end of the second switch; and a second transistor pair in which one end of the first switch is connected to a base or a gate of the first transistor, one end of a third switch is connected to the other end of the first switch, and a base or a gate of a third transistor is connected to the other end of the third switch, and a connection point between the first switch and each of the second switch and the third switch is connected to an output end of the first operating amplifier.

7. A current voltage converter circuit according to claim 6, wherein an inverted input end of the first operating amplifier is connected to a current input point of the current mirror circuit.

8. A current voltage converter circuit according to claim 1, wherein the first operating amplifier is configured to have a metal oxide semiconductor (MOS) type structure.

9. A current voltage converter circuit according to claim 8, wherein the first operating amplifier is configured of a metal oxide semiconductor (MOS) type differential amplifier comprising first and second N-channel MOS transistors and a current source.

10. A current voltage converter circuit according to claim 1, wherein the voltage converter circuit includes a resistor connected between an inverted input end and an output end of the second operating amplifier.

11. A current voltage converter circuit according to claim 1, wherein the current mirror circuit has at least:

a first transistor pair in which one end of a first switch is connected to a base or a gate of a first transistor, and a base or a gate of a second transistor is connected to the other end of the first switch; and a second transistor pair in which one end of a second switch is connected to a base or a gate of the first transistor, and a base or a gate of a third transistor is connected to the other end of the second switch.

* * * * *